United States Patent
Grewing et al.

(10) Patent No.: US 10,505,513 B2
(45) Date of Patent: Dec. 10, 2019

(54) FILTER CIRCUIT FOR SUPPRESSING SIGNAL DISTORTION

(71) Applicant: Forschungszentrum Jülich GmbH, Jülich (DE)

(72) Inventors: Christian Grewing, Jülich (DE); Markus Robens, Aachen (DE)

(73) Assignee: FORSCHUNGSZENTRUM JÜLICH GmbH (DE)

(*) Notice: Subject to any disclaimer, the term of this patent is extended or adjusted under 35 U.S.C. 154(b) by 139 days.

(21) Appl. No.: 15/743,063

(22) PCT Filed: Jul. 5, 2016

(86) PCT No.: PCT/EP2016/065850
§ 371 (c)(1),
(2) Date: Jan. 9, 2018

(87) PCT Pub. No.: WO2017/005744
PCT Pub. Date: Jan. 12, 2017

(65) Prior Publication Data
US 2018/0198435 A1    Jul. 12, 2018

(30) Foreign Application Priority Data

Jul. 9, 2015 (DE) .......... 10 2015 212 845

(51) Int. Cl.
*H03H 7/46* (2006.01)
*H04B 1/12* (2006.01)
(Continued)

(52) U.S. Cl.
CPC .......... *H03H 7/466* (2013.01); *H03F 3/2173* (2013.01); *H03H 7/0161* (2013.01); *H03H 7/46* (2013.01); *H04B 1/126* (2013.01)

(58) Field of Classification Search
CPC .... H04B 1/126; H03F 3/2173; H03H 7/0161; H03H 7/466; H03H 7/46
(Continued)

(56) References Cited

U.S. PATENT DOCUMENTS 4,918,314 A    4/1990  Sonne
2007/0054647 A1    3/2007  Hjelm
(Continued)

FOREIGN PATENT DOCUMENTS

DE    2719873 A1    11/1977
DE    10038616 B4    7/2012
WO    9310553 A1    5/1993

OTHER PUBLICATIONS

English translation of International Report on Patentability for corresponding international application No. PCT/EP2016/065850 dated Jan. 9, 2018.
(Continued)

*Primary Examiner* — Rakesh B Patel
(74) *Attorney, Agent, or Firm* — Tarolli, Sundheim, Covell & Tummino LLP (57) ABSTRACT

The invention relates to a filter circuit which, on the hardware level, prevents charge transfers caused by one or more currents in a frequency divider (200) from generating an interference signal that can cause a signal distortion at the output of a current-to-voltage converter (300) belonging to a filter circuit. This signal distortion would otherwise have to be removed by means of laborious post-processing of the signal. In this process, the voltage curve at the input of the frequency divider (200) or the current at the second output of the frequency divider (200) are employed so that, by means of a compensation circuit arrangement, it is possible to model a compensation signal that essentially compensates
(Continued)

for an interference signal caused by the charge transfers. The invention also relates to an associated method.

14 Claims, 8 Drawing Sheets

(51) Int. Cl.
    *H03H 7/01*     (2006.01)
    *H03F 3/217*     (2006.01)

(58) Field of Classification Search
    USPC .................................................. 333/12, 213
    See application file for complete search history.

(56) References Cited

U.S. PATENT DOCUMENTS

| | | |
|---|---|---|
| 2007/0063771 A1 | 3/2007 | Pan et al. |
| 2011/0098980 A1 | 4/2011 | Ouvrier-Buffet et al. |

OTHER PUBLICATIONS

"Chapter 5. How to Use Photomultiplier Tubes and Peripheral Circuits", Internet Citation, Jan. 1, 2006, pp. 83-112, found at URL: http://sales.hamamatsu.com/assets/applications/EDT/pmt_handbook_complete.pdf; retrieved on Mar. 7, 2007, 5.1.2 Anode grounding and cathode grounding; p. 85, figure 5-3; Chapters 53.1, 5.3.2, 5.3.3; p. 102-111; Figure 5-24. 5-28.
International Search Report for corresponding International Application No. PCT/EP2016/65850 dated Oct. 12, 2016.
Communication issued in corresponding German patent application 102015212845.8 dated Nov. 9, 2015.

FILTER CIRCUIT FOR SUPPRESSING SIGNAL DISTORTION

RELATED APPLICATIONS

The present invention is a U.S. National Stage under 35 USC 371 patent application, claiming priority to Serial No. PCT/EP2016/065850, filed on 5 Jul. 2016; which claims priority of DE 10 2015 212 845.8, filed on 9 Jul. 2015, the entirety of both of which are incorporated herein by reference.

FIELD OF THE INVENTION

The invention relates to a filter circuit to suppress a signal distortion as well as to an associated method to suppress a signal distortion.

BACKGROUND OF THE INVENTION

The signal path of a receiver is coupled to a signal source. The operating point of this signal source is often not the same one that the receiver needs. For instance, an antenna is frequently operated at ground level, or a photomultiplier tube (PMT) is operated at approximately 2000V. For this reason, a high-pass filter is used in order to separate the operating points. This high-pass filter is, in principle, a capacitor. If a low-pas filter is installed on one side of the capacitor in order to prescribe an operating point, this is also called a bias tee. Such an arrangement is prone to signal distortions.

SUMMARY OF THE INVENTION

It is an objective of the present invention to put forward an improved filter circuit.

According to a first aspect of the invention, a filter circuit to suppress a signal distortion is being put forward. The filter circuit comprises a current-to-voltage converter, a frequency divider and a compensation circuit arrangement. The frequency divider has at least one input, a first output and a second output. The input of the frequency divider has a first impedance in a first frequency band and a second impedance in a second frequency band. The second frequency band has higher frequencies than the first frequency band. The first output has a third impedance in the first frequency band and a fourth impedance in the second frequency band, and the absolute value of the fourth impedance is greater than or equal to the absolute value of the third impedance. The second output has a fifth impedance in the first frequency band and a sixth impedance in the second frequency band, and the absolute value of the fifth impedance is greater than or equal to the absolute value of the sixth impedance. An input of the current-to-voltage converter is connected to the second output of the frequency divider. The compensation circuit arrangement is configured to detect a first signal current between the input and the first output of the frequency divider. The signal current generates a distortion current between the input of the current-to-voltage converter and the second output of the frequency divider. The compensation circuit arrangement is also configured to compensate for the distortion current in such a way that a distortion-free output signal is made available. In this context, the expression "distortion-free output signal" is to be understood such that the interference caused by the distortion current is essentially no longer relevant, for example, for a receiver that receives the distortion-free output signal for purposes of further processing. Consequently, the distortion is reduced at the hardware level, it is preferably completely suppressed at the hardware level, so that it is possible to largely avoid a laborious post-processing of the output signal of the filter circuit. The signal current can be detected at the input as well as at the first output of the frequency divider. The filter circuit is especially employed for applications in high-grade detectors or, for instance, as an integrated circuit on detector chips.

In one embodiment, the compensation circuit arrangement is connected between the input of the frequency divider and the second output of the frequency divider. Therefore, as seen from a signal source from which the signal current stems, the compensation circuit arrangement is connected between the impedances that define the first and second outputs of the frequency divider. Thus, in essence, a voltage signal is used at the input of the frequency divider in order to control the compensation circuit arrangement. A compensation signal which serves to compensate for the distortion current and which is generated by the compensation circuit arrangement is preferably coupled in between the second output of the frequency divider and the input of the current-to-voltage converter.

In another embodiment, the compensation circuit arrangement is connected at the first output of the frequency divider. Therefore, as seen from a signal source from which the signal current stems, the compensation circuit arrangement is connected downstream from the impedance(s) that define(s) the first output of the frequency divider. Thus, in essence, a current signal is used at the first output of the frequency divider in order to control the compensation circuit arrangement. A compensation signal which serves to compensate for the distortion current and which is generated by the compensation circuit arrangement is preferably coupled in at the output of the current-to-voltage converter.

The frequency divider preferably has a first ohmic resistor in the first output and a first capacitor in the second output, whereby the first ohmic resistance is greater than a line resistance in the input of the frequency divider. In this embodiment, the structure of the frequency divider is essentially a very simple form of a frequency divider. Alternative embodiments comprising additional passive components could be employed.

The compensation circuit arrangement, as already indicated above, is configured in one embodiment to convert a signal voltage at the input of the frequency divider into a compensation current. Here, the compensation circuit arrangement is configured in such a way that the compensation current is opposite to the distortion current and, if possible, it is of the same magnitude, and it essentially compensates for the distortion current, for example, when coupled in between the second output of the frequency divider and the input of the current-to-voltage converter.

In one embodiment, the compensation circuit arrangement has a second capacitor. The second capacitor is connected to a high-resistance amplifier in order to relay the signal voltage to the high-resistance amplifier. Here, the high-resistance amplifier is configured to convert the signal voltage into the compensation current. The term "high-resistance amplifier" means that the signal at the input of the frequency divider is not influenced or is not essentially influenced by the amplifier. In this context, the second capacitor that serves to couple in the high-frequency interference signal into the high-resistance amplifier preferably has the same capacitance as the first capacitor. Via a second ohmic resistor, the compensation current is preferably connected to the side of the first capacitor facing the currentto-voltage converter. The second ohmic resistance is preferably precisely of the same magnitude as the first ohmic resistance.

Another embodiment of the filter circuit has a compensation circuit arrangement with a current sensor. The current sensor is preferably configured to detect a current that flows through the first ohmic resistor. The current sensor is preferably configured to control a regulatable current source in such a way that a signal distorted by the distortion current is compensated for at the output of the current-to-voltage converter. Here, the compensation circuit arrangement preferably has a second ohmic resistor between the output of the current-to-voltage converter and the regulatable current source so that the distorted signal is compensated in between the regulatable current source and the second ohmic resistor.

It is another objective of the present invention to put forward an improved signal receiver.

The signal receiver comprises a receiver and a filter circuit of the type described above. The receiver is configured to receive a signal via the filter circuit.

Another objective of the present invention is to put forward an improved signal analyzer.

The signal analyzer comprises a signal receiver of the type described above as well as an analysis unit. The analysis unit is configured to analyze the signal received by the receiver.

Another objective of the present invention is to put forward an improved method to suppress a signal distortion. The method encompasses the following steps:

a distortion current between an input of a current-to-voltage converter and a second output of a frequency divider is generated by means of a first signal current between an input and a first output of the frequency divider, whereby an input of the current-to-voltage converter is connected to the second output of the frequency divider;

the first signal current is detected, whereby the frequency divider comprises at least the input, the first output and the second output, whereby the input has a first impedance in a first frequency band and a second impedance in a second frequency band, and the second frequency band has higher frequencies than the first frequency band, whereby the first output has a third impedance in the first frequency band and a fourth impedance in the second frequency band, and the absolute value of the fourth impedance is greater than or equal to the absolute value of the third impedance, whereby the second output has a fifth impedance in the first frequency band and a sixth impedance in the second frequency band, and the absolute value of the fifth impedance is greater than the absolute value of the sixth impedance;

the distortion current is compensated for.

The individual steps of the method do not necessarily have to be carried out in the sequence indicated above.

It is pointed out that the filter circuit, the signal receiver and the method according to the claims have similar and/or identical configurations, especially as these are described in the dependent claims.

It is also pointed out that every combination of the dependent claims with the corresponding independent claims also constitutes a preferred embodiment of the invention.

Additional preferred embodiments are described below.

BRIEF DESCRIPTION OF THE FIGURES

These and other aspects of the invention are shown in detail in the figures as follows.

DETAILED DESCRIPTION OF THE EMBODIMENTS

Figure 1:
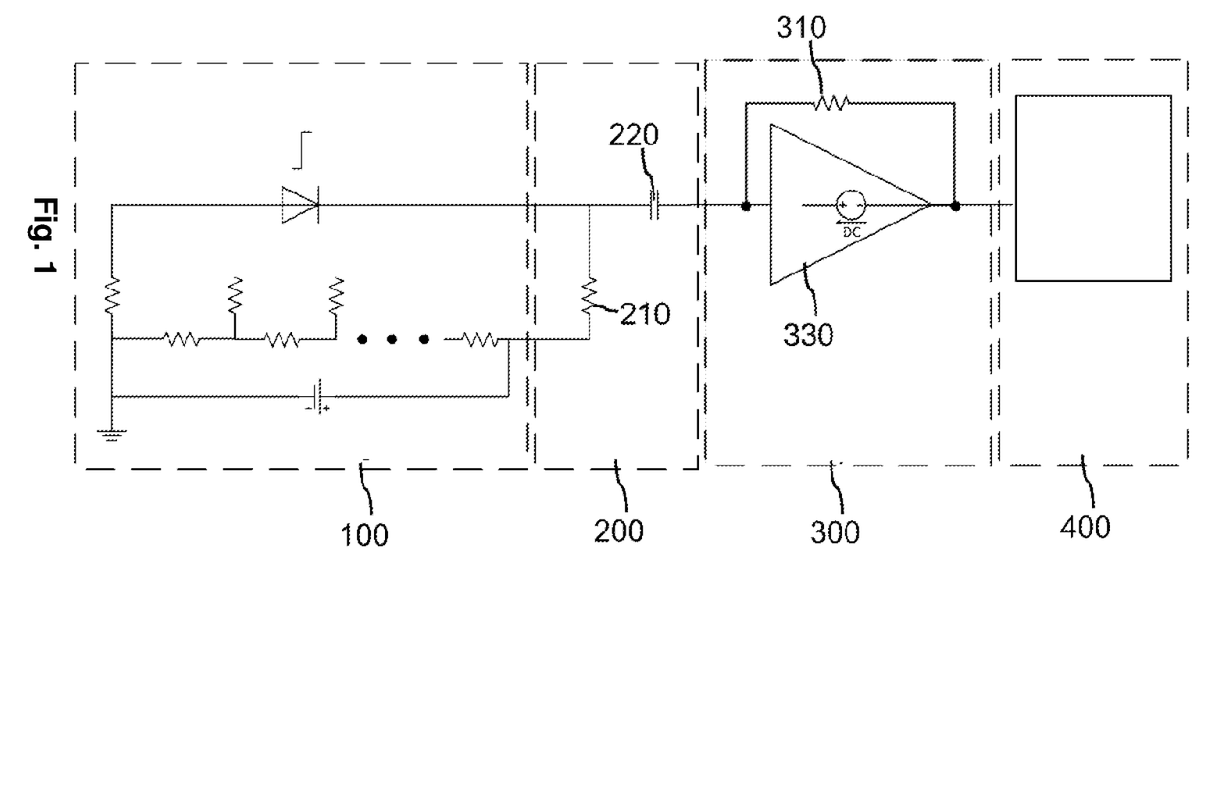
FIG. 1 shows a schematic diagram of a signal source that is coupled to a receiver via a high-pass filter.

FIG. 1 shows a schematic diagram of a signal source 100 that is coupled to a receiver 400 via a high-pass filter. In the present case, the signal source 100 is a photomultiplier. The high-pass filter comprises a frequency divider 200 and a current-to-voltage converter 300. The frequency divider 200 is configured as a bias tee having a first capacitor 220 between an input of the frequency divider 200 and a second output, and having a first ohmic resistor 210 between the input and a first output of the frequency divider 200. The second output of the frequency divider 200 is connected to an input of the current-to-voltage converter 300, whereby the current-to-voltage converter 300 is configured as a transimpedance amplifier 330 having a transimpedance resistor 310, whereby an output of the transimpedance amplifier 330 is fed back or negatively fed back to the input of the transimpedance amplifier 330 via the transimpedance resistor 310. Other implementations of the transimpedance amplifier are likewise possible. The signal 325 at the output of the transimpedance amplifier 330 is relayed to the receiver 400. The transimpedance amplifier 330 regulates the side of the first capacitor 220 in such a way that the voltage hardly changes (virtual ground). In contrast, the high-voltage side is high-resistance due to the first ohmic resistor 210 of the bias tee. The charge on the side of the first capacitor 220 facing away from the transimpedance amplifier 330 is equalized on the side of the first capacitor 220 facing the transimpedance amplifier 330, thereby distorting the signal 325, as is further elucidated in FIGS. 2 and 3.

Figure 2:
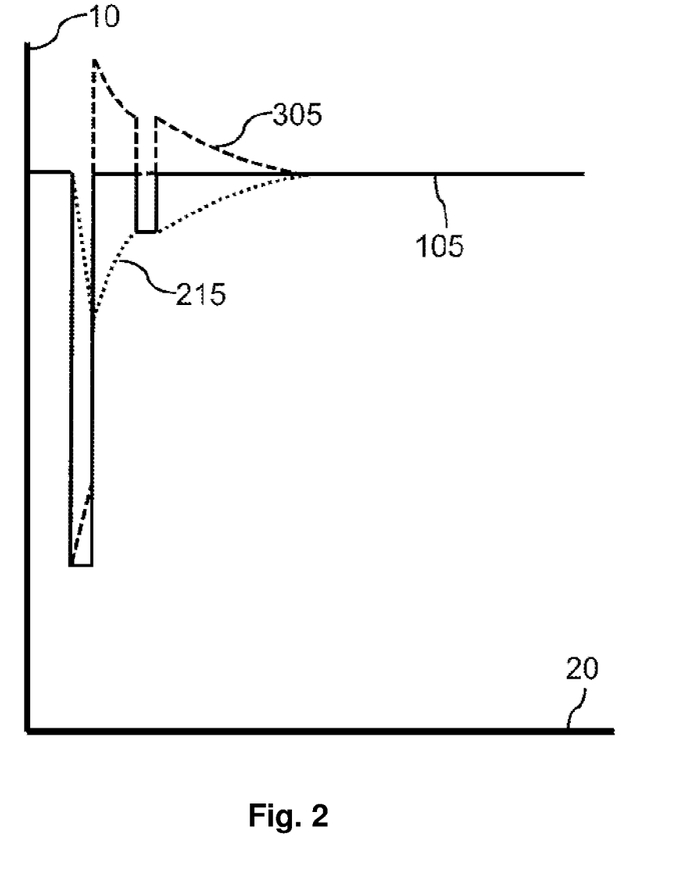
FIG. 2 shows a graph with various currents of the arrangement depicted in FIG. 1.

FIG. 2 shows a graph with various currents of the arrangement depicted in FIG. 1. The y-axis indicates the current intensity 10 and the x-axis indicates the time 20. The magnitude of the signals is a few 100 mA and the length of the pulses is a few microseconds. In this example, the signal current 105 stemming from the signal source 100 has a large pulse that is followed by a small pulse at short intervals. Both pulses should be detected independently of each other in the receiver 400. A first signal current 215, which flows through the first ohmic resistor 210, generates a charge transfer on the side of the first capacitor 220 facing the transimpedance amplifier 330. This charge transfer is associated with a distortion current that is superimposed on the signal current 105 and that generates a distorted current signal 305.

Figure 3:
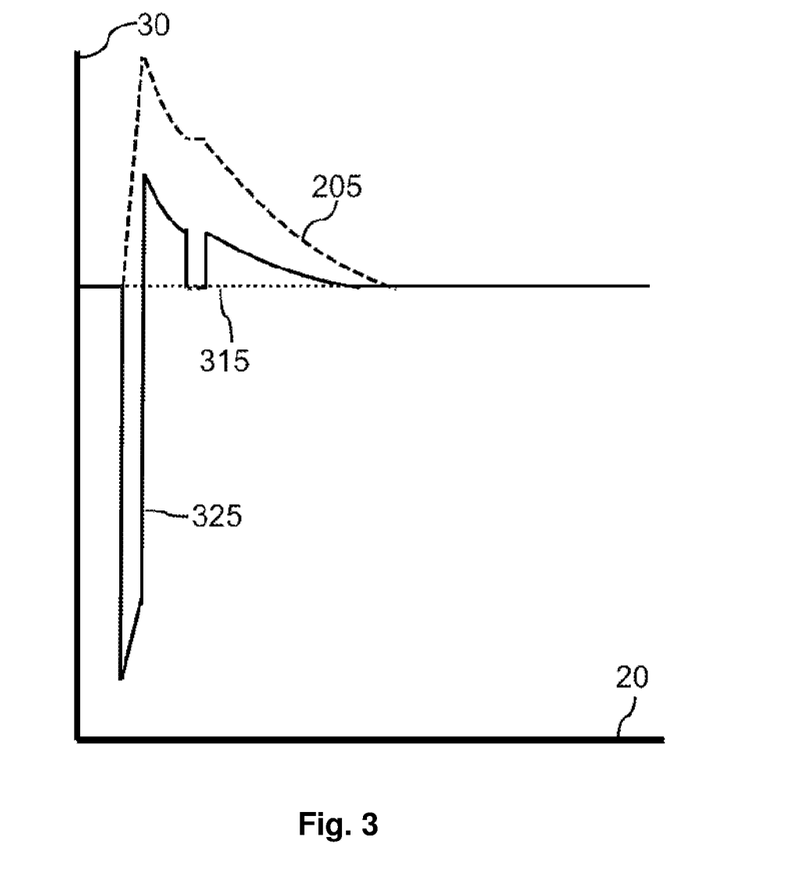
FIG. 3 shows a graph with various voltages of the arrangement depicted in FIG. 1.

FIG. 3 shows a graph with various voltages of the arrangement depicted in FIG. 1. The y-axis indicates the voltage 30 and the x-axis indicates the time 20. The graph shows the voltage that is present at the input of the transimpedance amplifier 315 and that is essentially constant. The signal voltage 205 at the input of the frequency divider 200 (bias tee), which is facing the signal source 100 (photomultiplier), rises sharply at the beginning of the large pulse and subsequently drops until the beginning of the small pulse, then remains at a virtually constant level for the duration of the small pulse and finally once again falls within a few microseconds to 0 after the end of the small pulse. The time course of the voltage at the output of the transimpedance amplifier, in other words, the signal 325 that is relayed to the receiver 400, has the same form as the distorted current signal 305. The signal 325 is thus distorted by the distortion current.

Figure 4:
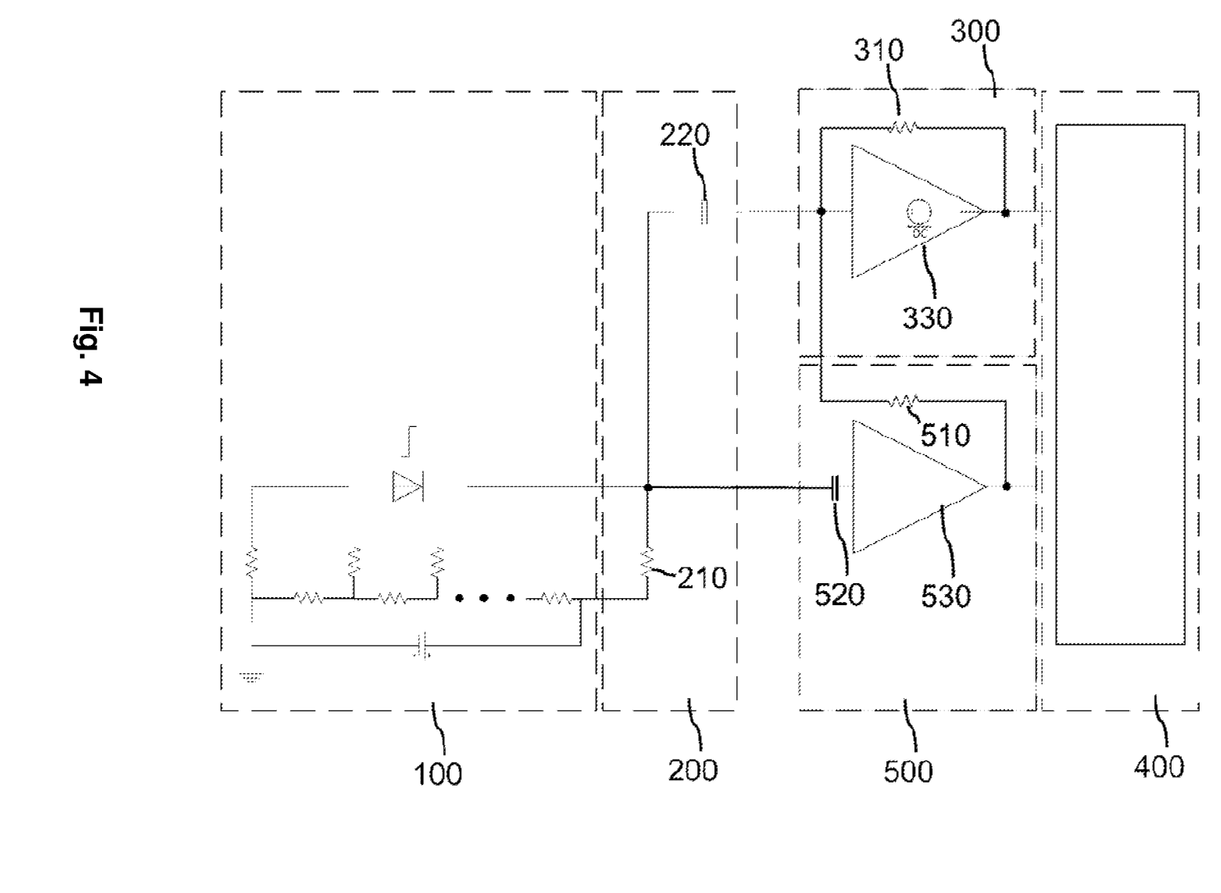
FIG. 4 shows a schematic diagram of a signal source that is coupled to a receiver via a first filter circuit.

FIG. 4 shows a schematic diagram of a signal source 100 that is coupled to a receiver 400 via a first filter circuit. In the present case, the signal source 100 is a photomultiplier. The filter circuit comprises a frequency divider 200, a current-to-voltage converter 300 and a compensation circuit arrangement 500. The frequency divider 200 is configured as a bias tee having a first capacitor 220 between an input of the frequency divider 200 and a second output, and having a first ohmic resistor 210 between the input and a first output of the frequency divider 200. The second output of the frequency divider 200 is connected to an input of the current-to-voltage converter 300, whereby the current-to-voltage converter 300 is configured as a transimpedance amplifier 330 having a transimpedance resistor 310, whereby an output of the transimpedance amplifier 330 is fed back to the input of the transimpedance amplifier 330 via the transimpedance resistor 310. The signal 325a at the output of the transimpedance amplifier 330 is relayed to the receiver 400. The transimpedance amplifier 330 regulates the side of the first capacitor 220 in such a way that the voltage hardly changes (virtual ground). In contrast, the high-voltage side is high-resistance due to the first ohmic resistor 210 of the bias tee. The charge on the side of the first capacitor 220 facing away from the transimpedance amplifier 330 is equalized on the side of the first capacitor 220 facing the transimpedance amplifier 330. Moreover, via a second capacitor 520 of the compensation circuit arrangement 500, the input of the frequency divider 200 (bias tee) is connected to an input of a high-resistance amplifier 530 of the compensation circuit arrangement 500. In this embodiment, the capacitance of the second capacitor 520 is selected so as to be equal to the capacitance of the first capacitor 220. Via a second ohmic resistor 510 of the compensation circuit arrangement 500, an output of the high-resistance amplifier 530 is connected to the side of the capacitor 220 facing the input of the transimpedance amplifier. The second ohmic resistance 510 is of the same magnitude as the first ohmic resistance 210. Due to the second capacitor 520, the signal voltage 205a is fed to the high-resistance amplifier 530 at the input of the frequency divider 200. The signal voltage 205a is converted by the high-resistance amplifier 530 into a current that, as a compensation current 515, compensates for the charge transfer on the side of the first capacitor 220 facing the transimpedance amplifier 330. Therefore, the current for the charge transfer is no longer made available by the transimpedance amplifier 330, so that the signal 325a is no longer distorted. The capacitance of the second capacitor 520 and the value of the second resistor 510 can be adapted as a function of additional components that are connected to the high-resistance amplifier 530. Consequently, it is not necessarily the case that the capacitance of the second capacitor 520 and the resistance of the second resistor 510 are identical to the capacitance of the first capacitor 220 and of the first resistor 210. Such additional components can be employed or can be necessary, for example, in order to compensate for a less-than-ideal behavior of the high-resistance amplifier 530.

Figure 5:
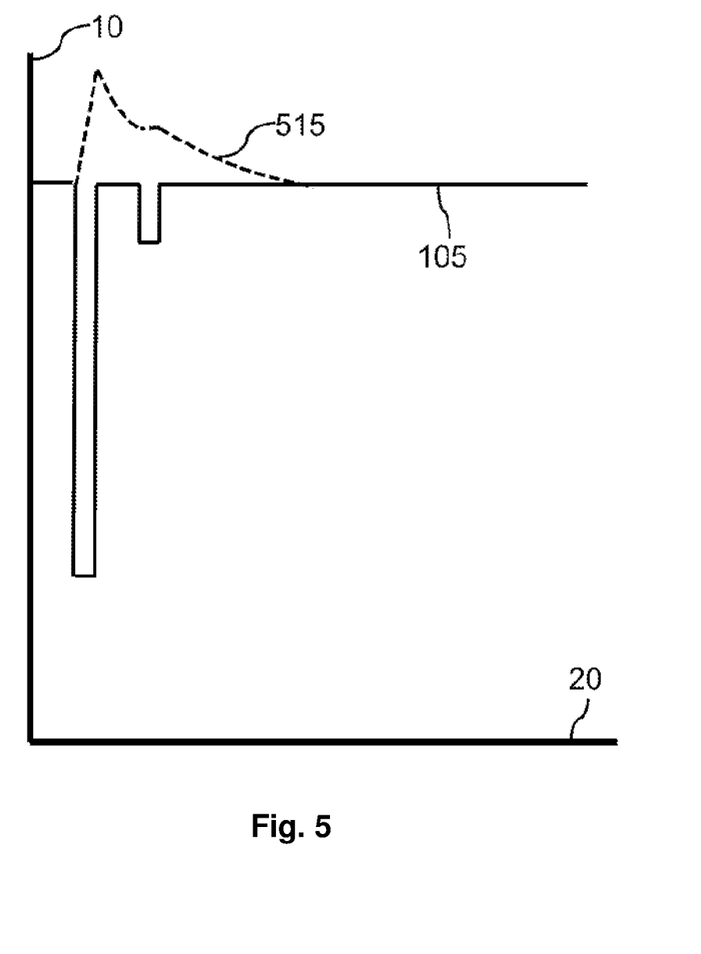
FIG. 5 shows a graph with various currents of the arrangement depicted in FIG. 4.

FIG. 5 shows a graph with various currents of the arrangement depicted in FIG. 4. The y-axis indicates the current intensity 10 and the x-axis indicates the time 20. The magnitude of the signals is a few 100 mA and the length of the pulses is a few microseconds. In this example, once again, the signal current 105 stemming from the signal source 100 has a large pulse that is followed by a small pulse at a short interval. Both pulses should be detected independently of each other in the receiver 400. The first signal current 215 shown in FIG. 2, which flows through the first ohmic resistor 210, generates a charge transfer on the side of the first capacitor 220 facing the transimpedance amplifier 330. This charge transfer is associated with a distortion current. The compensation circuit arrangement 500 then generates the compensation current 515 that is opposite to the distortion current and that compensates for the latter. The signal current 105 is thus not distorted.

Figure 6:
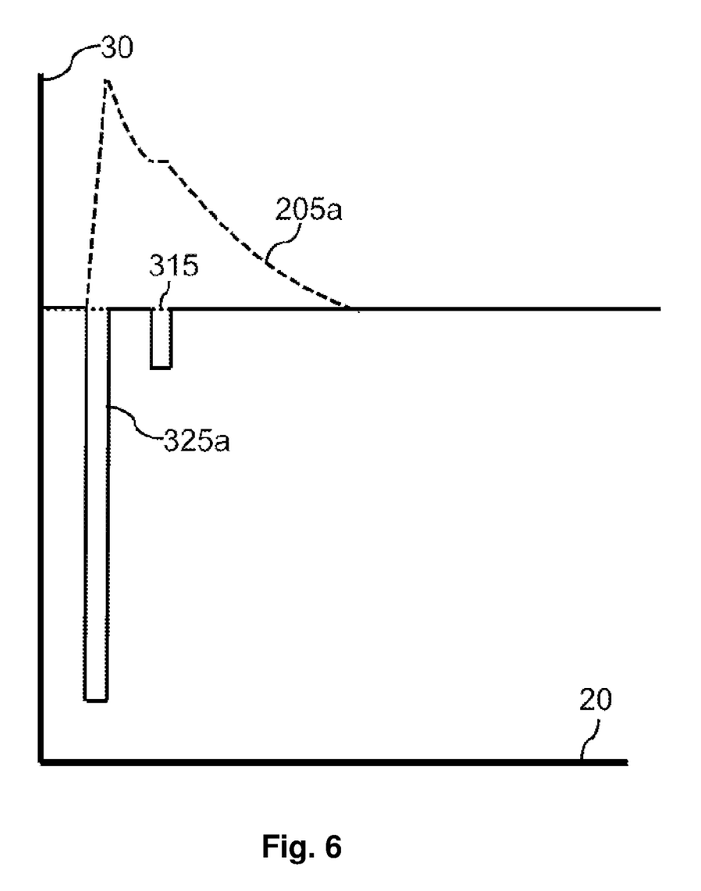
FIG. 6 shows a graph with various voltages of the arrangement depicted in FIG. 4.

FIG. 6 shows a graph with various voltages of the arrangement depicted in FIG. 4. The y-axis indicates the voltage 30 and the x-axis indicates the time 20. The graph depicts the voltage that is present at the input of the transimpedance amplifier 315 and that is once again essentially constant. The signal voltage 205a at the input of the frequency divider 200 (bias tee), which is facing the signal source 100 (photomultiplier), rises sharply at the beginning of the large pulse and subsequently drops until the beginning of the small pulse, then remains at a virtually constant level for the duration of the small pulse and finally once again falls within a few microseconds to 0 after the end of the small pulse. The time course of the voltage at the output of the transimpedance amplifier, in other words, the signal 325a that is relayed to the receiver 400, has the same form as the signal current 105. The distortion caused by the distortion current is compensated for by the compensation current 515 so that the large as well as the subsequent small pulse can be detected in the receiver without any laborious post-processing of the signal.

Figure 7:
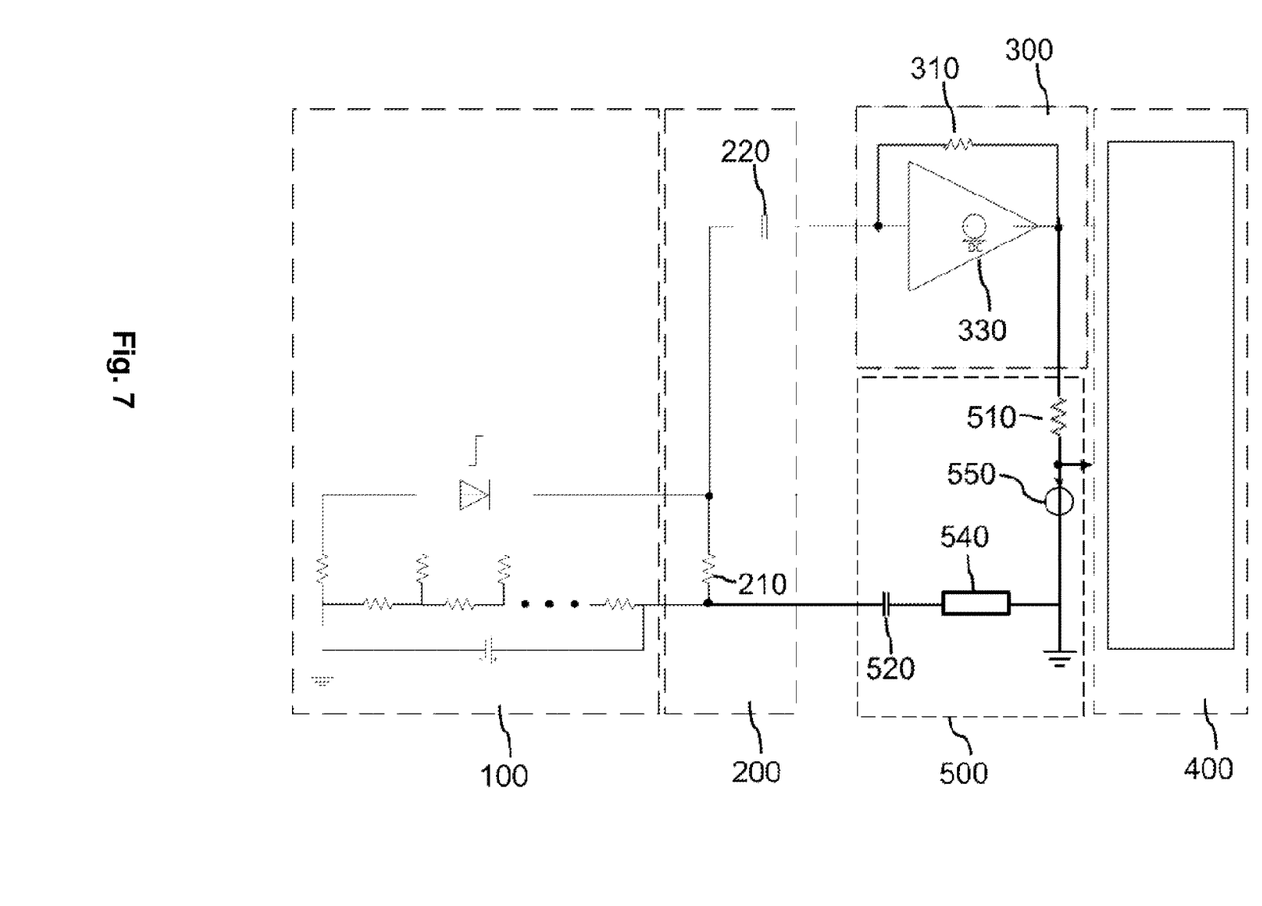
FIG. 7 shows a schematic diagram of a signal source that is coupled to a receiver via a second filter circuit.

FIG. 7 shows a schematic diagram of a signal source 100 that is coupled to a receiver 400 via a second filter circuit. In the present case, the signal source 100 is a photomultiplier. The filter circuit comprises a frequency divider 200, a current-to-voltage converter 300 and a compensation circuit arrangement 500. The frequency divider 200 is configured as a bias tee having a first capacitor 220 between an input of the frequency divider 200 and a second output, and having a first ohmic resistor 210 between the input and a first output of the frequency divider 200. The second output of the frequency divider 200 is connected to an input of the current-to-voltage converter 300, whereby the current-to-voltage converter 300 is configured as a transimpedance amplifier 330 having a transimpedance resistor 310, whereby an output of the transimpedance amplifier 330 is fed back to the input of the transimpedance amplifier 330 via the transimpedance resistor 310. The signal at the output of the transimpedance amplifier 330 is relayed to the receiver 400 via a second ohmic resistor 510 of the compensation circuit arrangement 500. The transimpedance amplifier 330 regulates the side of the first capacitor 220 in such a way that the voltage hardly changes (virtual ground). In contrast, the high-voltage side is high-resistance owing to the first ohmic resistor 210 of the bias tee. The charge on the side of the first capacitor 220 facing away from the transimpedance amplifier 330 is equalized by means of the transimpedance amplifier 330 on the side of the first capacitor 220 facing the transimpedance amplifier 330. Therefore, the output signal of the transimpedance amplifier is interfered with, as discussed in conjunction with FIG. 1. Via a second capacitor 520, the first output of the frequency divider 200 (bias tee) is connected to an input resistor 540 of a current sensor. The input resistance 540 here is selected so as to be smaller than the first ohmic resistance 210 in order to influence the current flow through the first resistor 210 to the smallest extent possible. The current flowing through the input resistor 540 here is now used as a regulating current for purposes of controlling the regulatable current source 550. The regulatable current source 550 amplifies the regulating current so that, in terms of the voltage, the regulating current compensates for the voltage of the interference signal of the output of the transimpedance amplifier 330 upstream from the second ohmic resistor 510 as seen from the regulatable current source 550, so that the signal 325a that is relayed to the receiver 400 is no longer distorted. In this context, the second ohmic resistance 510 is preferably smaller than the first ohmic resistance 210 and, in an especially preferred embodiment, it is of a magnitude that corresponds to the difference between the first ohmic resistance 210 and the transimpedance resistance 310. A possible embodiment for a regulatable current source 550 in combination with the low-resistance input resistor 540 would be, for instance, a current mirror that amplifies the regulating current by means of an adapted mirror factor and that provides a compensation current in order to compensate for the interference with the output signal of the transimpedance amplifier 330. The capacitance of the second capacitor 520 and the value of the second resistor 510 can be adapted as a function of additional components that are connected to the current sensor. The capacitance of the second capacitor 520 and the resistance of the second resistor 510 are selected as a function of the actual configuration of the current sensor, whereby, if applicable, it is necessary to compensate for the actual behavior of the components employed.

In contrast to the circuit shown in FIG. 4, in the circuit shown in FIG. 7, it is not the signal at the input of the transimpedance amplifier 330 that is corrected or compensated for, but rather the signal at the output of the transimpedance amplifier 330. In this manner, as desired, it is possible to use either the voltage signal at the input of the frequency divider 200 or the current signal at the first output of the frequency divider 200 as the control signal for the compensation. The correction signal generated by means of the control signal can be fed in at any desired place between the input and the output of the transimpedance amplifier 330. It is merely necessary to know how the interference signal at the input of the transimpedance amplifier 330 was transformed at a defined point inside the circuit of the transimpedance amplifier 330. On the basis of this knowledge, it is possible to determine which circuit is necessary in order to use the control signal to compensate for the interference at this defined point.

The transimpedance resistance 310 is essentially determined by the supply voltage and the current intensity of the signal. Both of these depend on the application in question, so that the concrete value of the transimpedance resistance 310 can be calculated as a function of the application in question. The concrete values of the first ohmic resistor 210, of the second ohmic resistor 510, of the first capacitor 220 and of the second capacitor 520 all depend especially on the frequency of the signal. The frequency of the signal is likewise dependent on the application in question, so that the values can be calculated as a function of the application in question.

Figure 8:
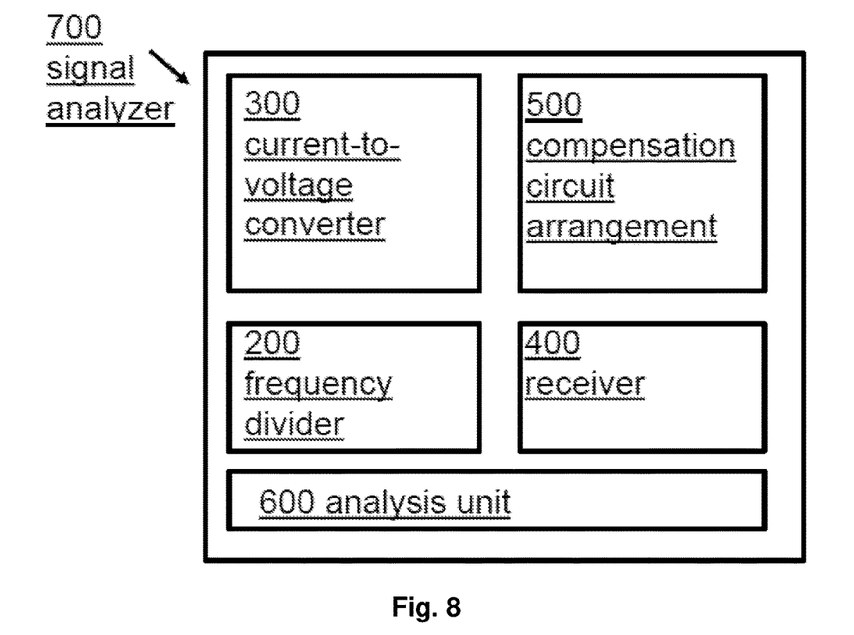
FIG. 8 shows a schematic diagram of a signal analyzer.

FIG. 8 shows a schematic diagram of a signal analyzer 700. The signal analyzer 700 comprises a signal receiver and an analysis unit 600. The signal receiver comprises a receiver 400 and a filter circuit of the type described, for example, in conjunction with FIG. 4. The receiver is configured to receive a signal 325a via the filter circuit. The analysis unit 600 is configured to analyze the signal 325a. The analysis unit 600 can comprise one or more microprocessors, processors, etc., one or more storage elements or storage modules in order to store and process data or signals.

Figure 9:
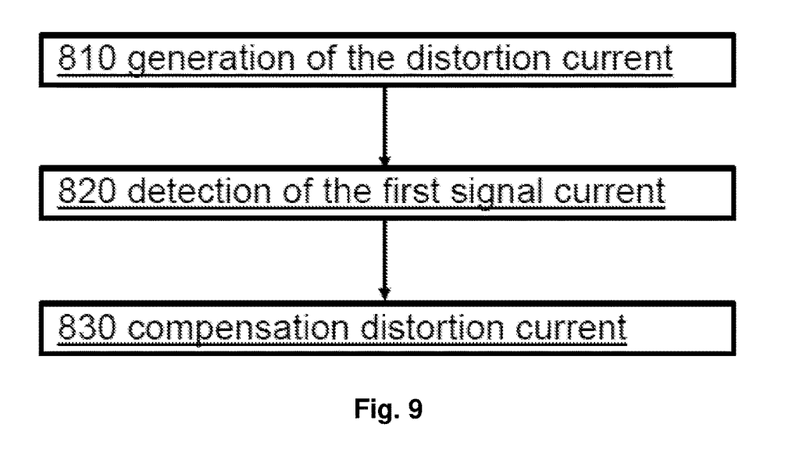
FIG. 9 shows a schematic diagram of a method to suppress a signal distortion.

FIG. 9 shows a schematic diagram of a method to suppress a signal distortion. In step 810, a distortion current is generated between an input of a current-to-voltage converter 300 and a second output of a frequency divider 200 by a first signal current between an input and a first output of the frequency divider 200. In this context, an input of the current-to-voltage converter 300 is connected to the second output of the frequency divider 200. In step 820, the first signal current is detected. The frequency divider 200 has at least the input, the first output and the second output. The input of the frequency divider 200 has a first impedance in a first frequency band, and a second impedance in a second frequency band. The second frequency band has higher frequencies than the first frequency band. The first output has a third impedance in the first frequency band, and a fourth impedance in the second frequency band, and the absolute value of the fourth impedance is greater than the absolute value of the third impedance. The second output has a fifth impedance in the first frequency band, and a sixth impedance in the second frequency band, and the absolute value of the fifth impedance is greater than the absolute value of the sixth impedance. In step 830, the distortion current is compensated for.

It is an idea of the present invention to use a filter circuit to prevent charge transfers caused by one or more currents in a frequency divider 200 from generating an interference signal that otherwise would have to be removed by means of laborious post-processing of the signal. In this process, the voltage curve at the input of the frequency divider 200 or the current at the second output of the frequency divider 200 are employed so that, by means of a compensation circuit arrangement, it is possible to generate a compensation signal that essentially compensates for an interference signal caused by the charge transfers. In this context, the compensation can take place as a function of the structure of the current-to-voltage converter 300 at any desired but defined place between the input and the output of the current-to-voltage converter 300.

Other variants of the invention and their execution can be gleaned by the person skilled in the art from the preceding disclosure, from the figures and from the patent claims.

Terms used in the patent claims such as "encompass", "comprise", "contain", "have" and the like do not exclude additional elements or steps. The use of the indefinite article does not preclude the plural. Each individual device can execute the functions of several of the units or devices cited in the patent claims. The reference numerals indicated in the patent claims are not to be construed as a limitation of the means and steps employed.

10 current intensity
20 time
30 voltage
100 signal source
105 signal current
200 frequency divider
205, 205a signal voltage
210 first ohmic resistor 215 first signal current
220 first capacitor
300 current-to-voltage converter
305 distorted current signal
310 transimpedance resistor
315 voltage at the input of the transimpedance amplifier
325, 325a signal
330 transimpedance amplifier
400 receiver
500 compensation circuit arrangement
510 second ohmic resistor
515 compensation current
520 second capacitor
530 high-resistance amplifier
540 input resistance sensor
550 regulatable current source
600 analysis unit
700 signal analyzer
810 generation of the distortion current
820 detection of the first signal current
830 compensation for the distortion current

The invention claimed is:

1. A filter circuit to suppress a signal distortion, comprising a current-to-voltage converter, a frequency divider and a compensation circuit arrangement,
   whereby the frequency divider has at least one input, a first output and a second output,
   whereby the at least one input of the frequency divider has a first impedance in a first frequency band and a second impedance in a second frequency band, and the second frequency band has higher frequencies than the first frequency band,
   whereby the first output has a third impedance in the first frequency band and a fourth impedance in the second frequency band, and the absolute value of the fourth impedance is greater than or equal to the absolute value of the third impedance,
   whereby the second output has a fifth impedance in the first frequency band and a sixth impedance in the second frequency band, and the absolute value of the fifth impedance is greater than or equal to the absolute value of the sixth impedance,
   whereby an input of the current-to-voltage converter is connected to the second output of the frequency divider,
   whereby the compensation circuit arrangement is configured to detect a first signal current between the at least one input and the first output of the frequency divider,
   whereby the signal current generates a distortion current between the input of the current-to-voltage converter and the second output of the frequency divider, and
   whereby the compensation circuit arrangement is configured to compensate for the distortion current in such a way that a distortion-free output signal is made available, at an output of the compensation circuit arrangement.

2. The filter circuit according to claim 1, whereby the compensation circuit arrangement is connected between the at least one input of the frequency divider and the second output of the frequency divider.

3. The filter circuit according to claim 1, whereby the compensation circuit arrangement is connected at the first output of the frequency divider.

4. The filter circuit according claim 1, whereby the frequency divider has a first ohmic resistor in the first output and a first capacitor in the second output, whereby a first ohmic resistance of the first ohmic resistor is greater than a line resistance in the at least one input of the frequency divider.

5. The filter circuit according to claim 4, whereby the compensation circuit arrangement is configured to convert a signal voltage at the at least one input of the frequency divider into a compensation current, and the compensation current is able to compensate for the distortion current.

6. The filter circuit according to claim 5, whereby the compensation circuit arrangement has a second capacitor, the second capacitor is connected to a high-resistance amplifier in order to relay the signal voltage to the high-resistance amplifier, and the high-resistance amplifier is configured to convert the signal voltage into the compensation current.

7. The filter circuit according claim 6, whereby the second capacitor has the same capacitance as the first capacitor.

8. The filter circuit according to claim 6, whereby the compensation current is connected via a second ohmic resistor to the first capacitor.

9. The filter circuit according to claim 8, whereby a second ohmic resistance of the second ohmic resistor is precisely of the same magnitude as the first ohmic resistance.

10. The filter circuit according to claim 4, whereby the compensation circuit arrangement has a current sensor, whereby the current sensor is configured to detect a current that flows through the first ohmic resistor, and the current sensor is also configured to control a regulatable current source in such a way that a signal distorted by the distortion current is compensated for at the output of the current-to-voltage converter.

11. The filter circuit according to claim 10, whereby the compensation circuit arrangement has a second ohmic resistor between the output of the current-to-voltage converter and the regulatable current source, and the distorted signal is compensated in between the regulatable current source and the second ohmic resistor.

12. A signal receiver comprising a receiver and a filter circuit according to claim 1, whereby the receiver is configured to receive a signal via the filter circuit.

13. A signal analyzer comprising a signal receiver according to claim 12 and an analysis unit, whereby the analysis unit is configured to analyze the signal.

14. A method to suppress a signal distortion, the method comprising:
   generating a distortion current between an input of a current-to-voltage converter and a second output of a frequency divider by means of a first signal current between an input and a first output of the frequency divider, whereby an input of the current-to-voltage converter is connected to the second output of the frequency divider;
   detecting the first signal current, whereby the frequency divider comprises at least the input, the first output and the second output, whereby the input has a first impedance in a first frequency band and a second impedance in a second frequency band, and the second frequency band has higher frequencies than the first frequency band, whereby the first output has a third impedance in the first frequency band and a fourth impedance in the second frequency band, and the absolute value of the fourth impedance is greater than or equal to the absolute value of the third impedance, whereby the second output has a fifth impedance in the first frequency band and a sixth impedance in the second frequency band, and the absolute value of the fifth impedance is greater than the absolute value of the sixth impedance; and compensating for the distortion current, by a compensation circuit arrangement.

* * * * *